(12) United States Patent
Somayajula

(10) Patent No.: US 6,448,911 B1
(45) Date of Patent: Sep. 10, 2002

(54) CIRCUITS AND METHODS FOR LINEARIZING CAPACITOR CALIBRATION AND SYSTEMS USING THE SAME

(75) Inventor: Shyam S Somayajula, Austin, TX (US)

(73) Assignee: Cirrus Logic, Inc.

( * ) Notice: Subject to any disclaimer, the term of this patent is extended or adjusted under 35 U.S.C. 154(b) by 0 days.

(21) Appl. No.: 09/918,852

(22) Filed: Jul. 30, 2001

(51) Int. Cl.[7] .............................................. H03M 1/10
(52) U.S. Cl. ...................... 341/120; 341/150; 341/172
(58) Field of Search ............................... 341/155, 156, 341/172, 118, 144, 161, 150, 120, 121; 340/347

(56) References Cited

U.S. PATENT DOCUMENTS

| | | | |
|---|---|---|---|
| 4,399,426 A | | 8/1983 | Tan |
| 4,451,821 A | | 5/1984 | Domogalla |
| 4,803,462 A | * | 2/1989 | Hester et al ................. 341/172 |
| 4,831,381 A | * | 5/1989 | Hester ........................ 341/172 |
| 4,975,700 A | * | 12/1990 | Tan et al. .................... 341/118 |
| 5,581,252 A | * | 12/1996 | Thomas ....................... 341/144 |
| 5,675,340 A | * | 10/1997 | Hester et al. ............... 341/156 |
| 5,684,487 A | * | 11/1997 | Timko ........................ 341/172 |

OTHER PUBLICATIONS

Lee, Hodges "Self–Calibration Techniques for A/D Converters" IEEE Transactions on Circuits and Systems, vol. CAS30, No. 3, Mar. 1983.

* cited by examiner

Primary Examiner—Brian Young
Assistant Examiner—John Nguyen
(74) Attorney, Agent, or Firm—James J. Murphy; Winstead Sechrest & Minick

(57) ABSTRACT

A switched capacitor circuit includes a plurality of capacitor arrays coupled to a node, including an input array, a trim array associated with a selected capacitor of the input array and an offset compensation array. A first plurality of switches selectively couple capacitors of the input and trim arrays to selected reference voltages to approximate an impedance presented at the node during a subsequent operation to trim the selected capacitor of the input array. A sampling switch samples the selected reference voltages onto the input and trim arrays, the sampling switch injecting a corresponding amount of charge on the node. A second plurality of switches then selectively couples capacitors of the offset compensation array to the selected reference voltages to compensate for the amount of charge injected onto the node.

20 Claims, 5 Drawing Sheets

CIRCUITS AND METHODS FOR LINEARIZING CAPACITOR CALIBRATION AND SYSTEMS USING THE SAME

CROSS REFERENCE TO RELATED APPLICATIONS

This application for patent is related to the following applications for patent:

U.S. patent application Ser. No. 09/919,181, filed Jul. 30, 2001 by inventor Somayajula, entitled "CIRCUITS AND METHODS FOR OFFSET VOLTAGE COMPENSATION IN A CHARGE REDISTRIBUTION DIGITAL TO ANALOG CONVERTER" currently pending;

U.S. patent application Ser. No. 09/919,014, filed Jul. 30, 2001 by inventor Somayajula, entitled "A HIGH SPEED SUCCESSIVE APPROXIMATION RETURN PATH AND DATA CONVERSION METHODS AND CIRCUITS USING THE SAME" currently pending;

U.S. patent application Ser. No. 09/919,411, filed Jul. 30, 2001 by inventor Somayajula, entitled "CIRCUITS AND METHODS FOR LATCH METASTABILITY DETECTION AND COMPENSATION AND SYSTEMS USING THE SAME" currently pending;

U.S. patent application Ser. No. 09/919,410, filed Jul. 30, 2000 by inventor Somayajula, entitled "ANALOG TO DIGITAL CONVERSION CIRCUITS, SYSTEMS AND METHODS WITH GAIN SCALING SWITCHED-CAPACITOR ARRAY" currently pending;

U.S. patent application Ser. No. 09/918,616, filed Jul. 30, 2001 by inventor Somayajula, entitled "HIGH SPEED, LOW-POWER SHIFT REGISTER AND CIRCUITS AND METHODS USING THE SAME" currently pending; and U.S. patent application Ser. No. 09/919,021, filed Jul. 30, 2000 by inventor Somayajula, entitled "METHODS AND CIRCUITS FOR COMPENSATING FOR FINITE COMMON MODE REJECTION IN SWITCHED CAPACITOR CIRCUITS" currently pending.

FIELD OF INVENTION

The present invention relates in general to switched capacitor circuits and in particular to circuits and methods for linearizing capacitor calibration and systems using the same.

BACKGROUND OF INVENTION

One particular technique for performing analog to digital (A/D) conversion is through successive approximation. The basic successive approximation A/D converter (ADC) includes an analog comparator and a clocked feedback loop having a successive approximation register (SAR) and a digital to analog converter (DAC).

Generally, the analog input signal voltage is sampled onto an array of weighted capacitors, during the sampling phase, the top plates of which are coupled to one comparator input. The other comparator input is coupled to a comparison voltage, which could be a fixed reference voltage in a single-ended system or the voltage at the top plates of second capacitor array in a differential system.

During the first clock cycle of the subsequent conversion phase, the bottom plate of the capacitor representing the digital MSB is coupled to a reference voltage while the bottom plates of the remaining capacitors in the array are coupled to ground or a second reference voltage (ground will be assumed here). The new top plate voltage appears at the input of the comparator and is compared against the comparison voltage. If the new top plate voltage is below the comparison voltage, then the MSB is "kept" by the SAR in the feedback loop by maintaining its bottom plate coupled to the reference voltage. On the other hand, if the top plate voltage is above the comparison voltage, the SAR couples and the bottom plate of the MSB capacitor to ground. The state of the MSB capacitor represent the MSB of the digital output word as a Logic 1. The bottom plate of the second MSB is then coupled to the reference voltage and the same test is performed to determine the state of the next digital code bit. The successive approximation algorithm continues by repeating this procedure for the remaining capacitors in the array such that the voltage difference at the inputs to the comparator converge to zero. At the end of this bit cycling process, the configuration of the switches coupling the bottom plates either to Vref or Gnd represents the input sample in digital form.

Successive approximation A/D converters are useful a wide range of applications, including data acquisition, test equipment, instrumentation, cellular communications, among others. Notwithstanding, in order to improve and broaden the utility of this type of A/D converter, significant challenges remain to be addressed. These challenges include improving the device speed given a set of process constraints, reducing the coding error rate, handling metastable states and device calibration

SUMMARY OF INVENTION

The inventive concepts allow for the compensation for varying voltage offsets appearing at a node in a switched capacitor circuit. These offsets may be caused, for example, by switch charge injection during the process of sampling a voltage onto the node, the charge injection varying as a function of the impedance appearing at the node at a given instant. These concepts are particularly useful with respects to capacitor arrays having one or more capacitors associated with a trim array, the trim array changing the impedance at a common node as trim capacitors are selectively used during trimming operations.

According to one specific embodiment of the principles of the present invention, a switched capacitor circuit is disclosed which includes a plurality of capacitor arrays coupled to a node, including an input array, a trim array associated with a selected capacitor of the input array, and an offset compensation array. A first set of switches are selectively used to couple capacitors of the input and trim arrays to selected reference voltages to approximate an impedance presented at the node during a subsequent operation to trim the selected capacitor of the input array. A sampling switch is included for sampling the selected reference voltages onto the input and trim arrays, the sampling switch injecting a corresponding amount of charge onto the node. This charge injection mismatch between the +ve and −ve array top plates coil appears as a code dependent offset to the trim cap calibration system. A second set of switches then selectively couples capacitors of the offset compensation array to the selected reference voltages to compensate for the amount of charge injected on the node by the sampling switch.

Advantageously, the present inventive concepts allow for a voltage offset resulting from charge injection onto a node during voltage sampling to be compensated for as each capacitor in the primary array is trimmed. Moreover, in circuits also including a comparator, any voltage offset introduced by that comparator can also be compensated for concurrently.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIG. 1–7 of the drawings, in which like numbers designate like parts.

Figure 1:
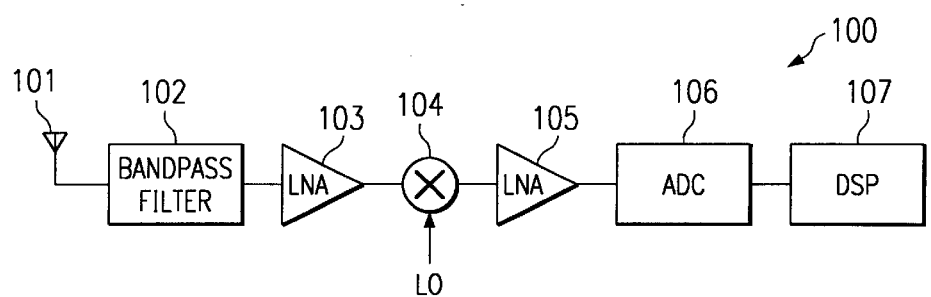
FIG. 1 is a high level block diagram of a digital receiver suitable for describing the principles of the present invention.

FIG. 1 is a high level block diagram of a digital receiver 100 suitable for describing the principles of the present invention. Generally, receiver 100 includes an RF input port or antenna 101 for receiving an RF signal, such as those used in telecommunications, and radio and television transmission. The desired RF signal is then extracted from the received signal by a bandpass filter 102. A low noise amplifier (LNA) 103 sets the system noise figure before the RF signal is downconverted in frequency by a mixer stage 104 operating in response to a local oscillator (LO). The output of mixer stage 104 may be passed through a second low noise amplifier (LNA) 105 before conversion into the digital domain.

In system 100, analog to digital conversion is performed using analog to digital converter (ADC) 200 discussed in detail below. Once converted into the digital domain, the received data can be processed using a digital signal processor (DSP) subsystem 106.

Figure 2:
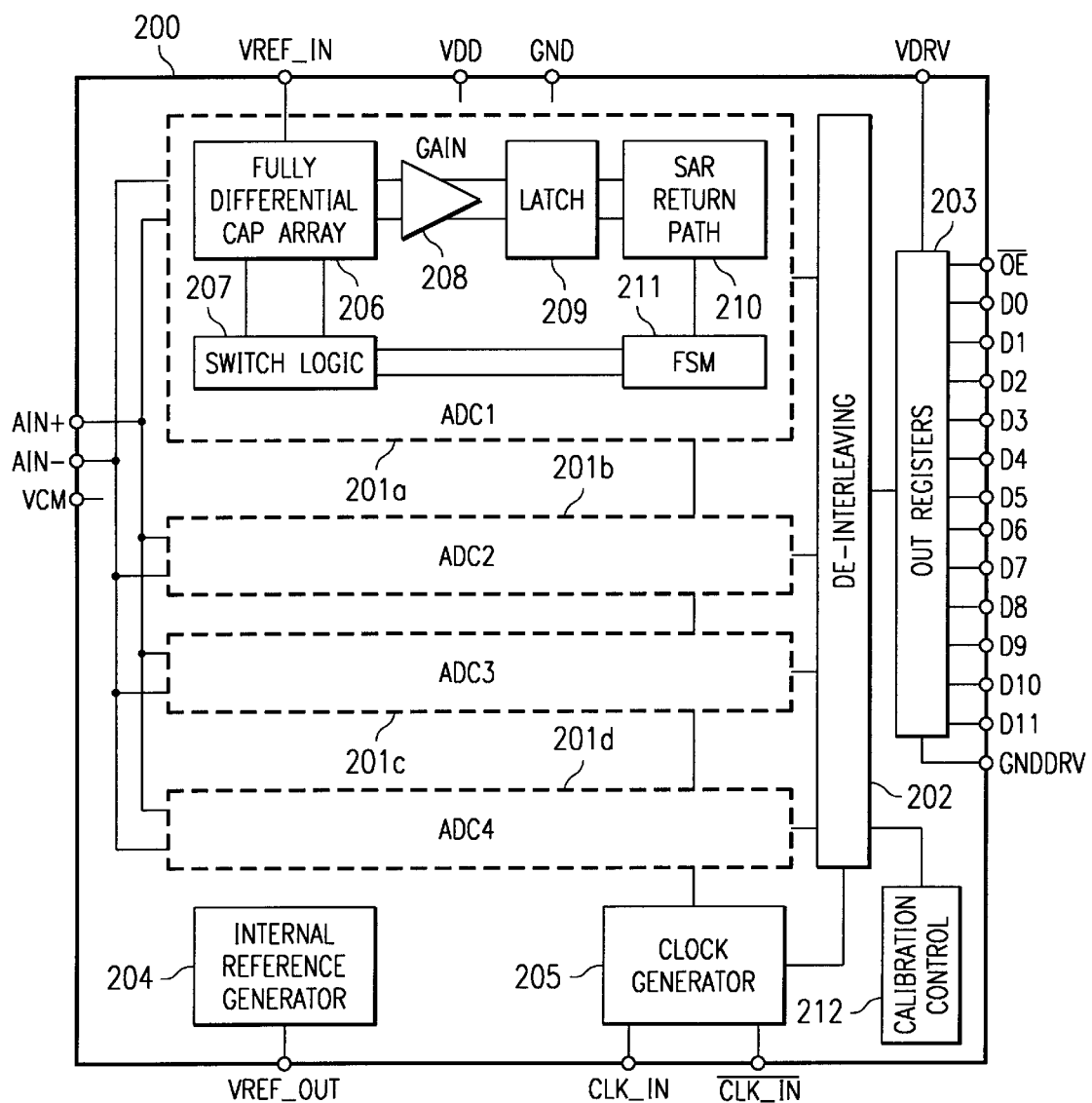
FIG. 2 is a high level functional block diagram of a single-chip analog to digital converter suitable for describing the present inventive concepts.

FIG. 2 is a high level functional block diagram of a single-chip analog to digital converter 200 suitable for describing the present inventive concepts. A/D converter 200 is based on 4 interleaved successive-approximation A/D converters (ADCs) 201, which will be discussed further below. The digitally coded samples are de-interleaved in block 202 and output through output register 203. AND converter 200 also includes an on-chip reference voltage generator 204, clock generator 205 and clock generation circuitry 206.

Each of the ADCs 202 includes a fully differential capacitor array 206 under control of switch control circuitry 207. During the tracking mode, capacitor array 206 samples the input voltage at the differential analog inputs AIN+ and AIN−. During the hold mode, the sampled charge is held while the successive approximation algorithm generates the digital bits.

A gain stage 208 with minimal gain provides signal isolation in front of latch (comparator) 209. SAR return path 210 and FSM 211 feedback the reference voltage to capacitor array 206.

In a conventional charge redistribution DAC, the bottom plate of a graduated filter array is coupled to the input during the sampling phase and all capacitors are charged to the input signal voltage. After the capacitors are charged, their bottom plates are coupled to ground during hold phase such that the top plates of the capacitors are at a voltage $V_X$ which is approximately equal to $-A_{IN}$, where $A_{IN}$ is the input sample voltage. During bit cycling, the bottom plate of the capacitor representing the MSB is coupled to the reference and the voltage of the top plate compared against the reference. The bottom capacitors of the remaining capacitors remain coupled to ground to form a voltage divider. If upper plate voltage is below the reference, then the capacitor continues to be coupled to the reference (i.e. a logic 1 for the bit), otherwise the bottom plate of the capacitor is recoupled to ground (i.e. reset to 0).

FIG. 2 is a high level functional block diagram of a single-chip analog to digital converter 200 suitable for describing the present inventive concepts. A/D converter 200 is based on 4 interleaved successive-approximation A/D converters (ADCs) 201, which will be discussed further below. The digitally coded samples are de-interleaved in block 202 and output through output register 203. A/D converter 200 also includes an on-chip reference voltage generator 204, clock generator 205 and clock generation circuitry 206.

Each of the ADCs 202 includes a fully differential capacitor array 206 under control of switch control circuitry 207 which implements the charge redistribution DAC discussed below. During the tracking mode, capacitor array 206 samples the :input voltage at the differential analog inputs AIN+ and AIN−. During the hold mode, the sampled charge is held while the successive approximation algorithm generates the digital bits.

A gain stage 208 with minimal gain provides signal isolation in front of latch (comparator) 209. SAR return path 210 and FSM 211 feedback determine whether a bit is kept (i.e. corresponding capacitor remains coupled to the reference voltage) or not kept (i.e. the corresponding capacitor is recoupled to ground).

In a conventional charge redistribution DAC, the bottom plate of a graduated (bit-weighted) filter array is coupled to the input during the sampling phase and all capacitors are charged to the input signal voltage. After the capacitors are charged, their bottom plates are coupled to ground during hold phase such that the top plates of the capacitors are at a voltage $V_X$ which is approximately equal to $-A_{IN}$, where $A_{IN}$ is the input sample voltage. During bit cycling, the bottom plate of the capacitor representing the MSB is coupled to the reference and the voltage of the top plate compared against the reference. The bottom capacitors of the remaining capacitors remain coupled to ground to form a voltage divider. If upper plate voltage is now below the reference, then the MSB capacitor continues to be coupled to the reference (i.e. the bit is kept), otherwise the bottom plate of the capacitor is recoupled to ground (i.e. the bit is not kept).

Figure 3:
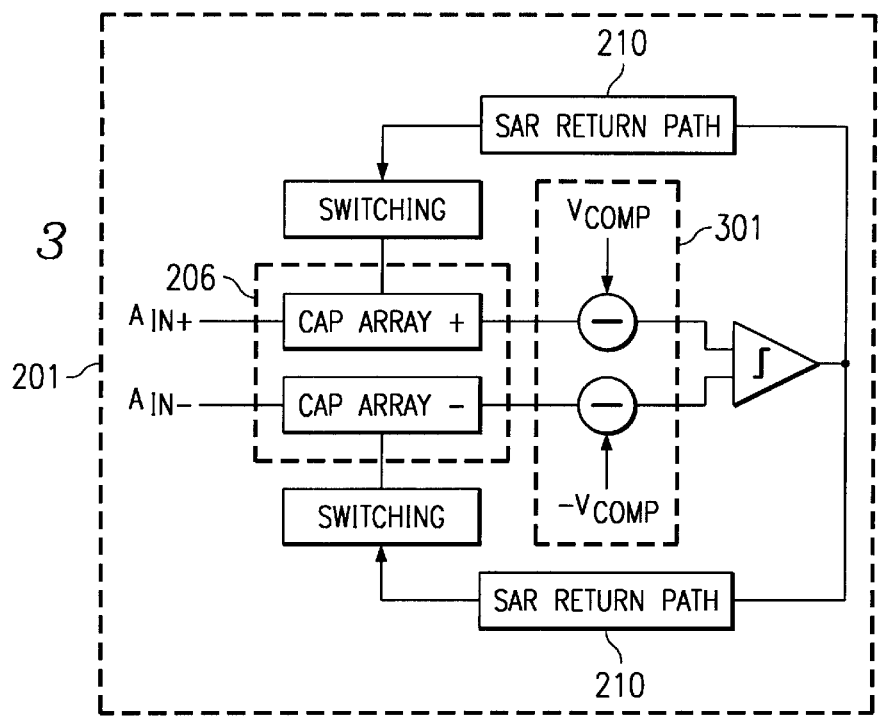
FIG. 3 illustrates one circuit embodiment of the principles of the present invention.

One circuit embodiment of the principles of the present invention is shown in FIG. 3. In this case, an error cancellation (compensation) stage 301, which is preferably a subtractor, is placed in front of the comparator. This cancellation stage receives feedback from the comparator output and cancels out the input voltage offset. The feedback loop allows the input offset to be dynamically cancelled as the input sample and reference voltages change and/or if the sampling or clock frequencies change. Cancellation stage 301 performs the cancellation operation in the analog domain, although its control is performed in the digital domain. A preferred charge redistribution DAC suitable with an integral offset compensation (cancellation) circuitry is discussed below in conjunction with FIG. 4.

Generally, there are two types of designs which must be considered, namely, those which can tolerate periodic recalibration for offset drift and those which cannot. According to the present principles, no front-end gain stages are used when recalibration for offset drift can be supported. In the second case, calibration is performed initially and then a small gain is provided at the front end:

$$\text{Gain} = \text{Offset drift of the latch (V)}/(\tfrac{1}{2}\text{ LSB})(V) \tag{1}$$

For example, for a maximum offset drift of 30 mV and a ½ LSB voltage swing of 300 pV, the nominal gain in front of the comparator will be 100. (This is in contrast with traditional systems in which the front end gain is typically 300 or more.)

The reduced gain advantageously reduces power consumption in the comparator, which can be the dominant factor in the overall SAR power consumption. Moreover, the comparator can run at a higher rate of speed for the given gain-bandwidth parameter.

Figure 4A:
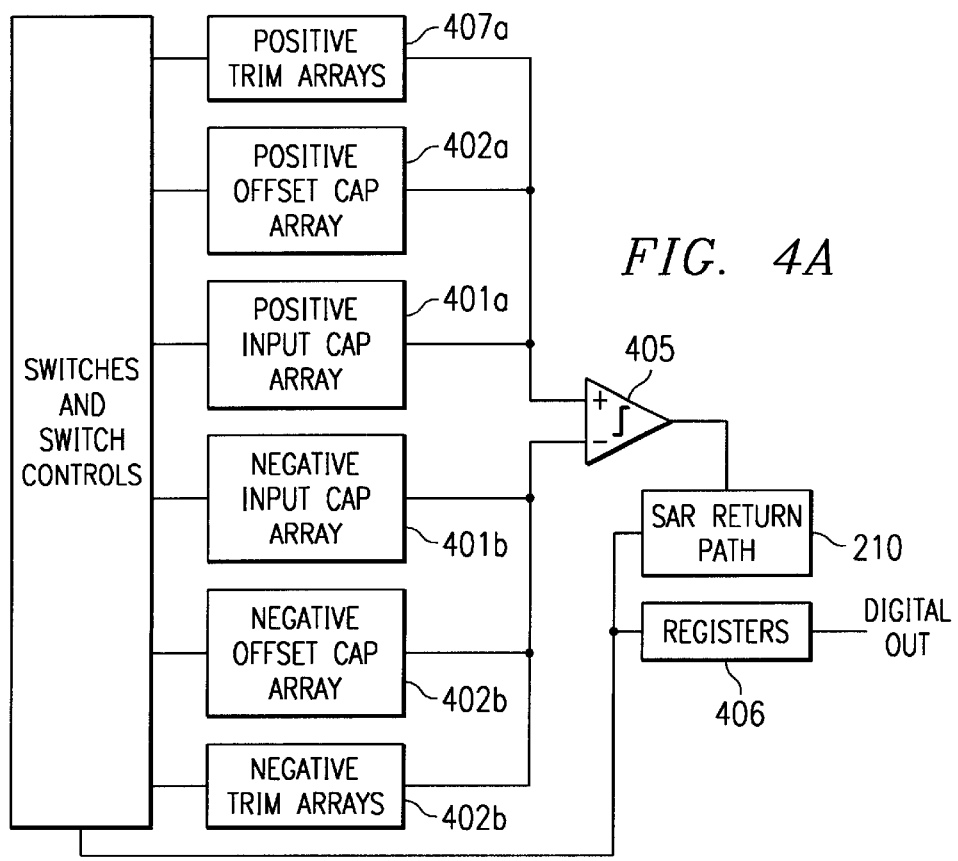
FIG. 4A is a functional block diagram of a switched-capacitor charge redistribution ADC embodying the present principles.
Figure 4B:
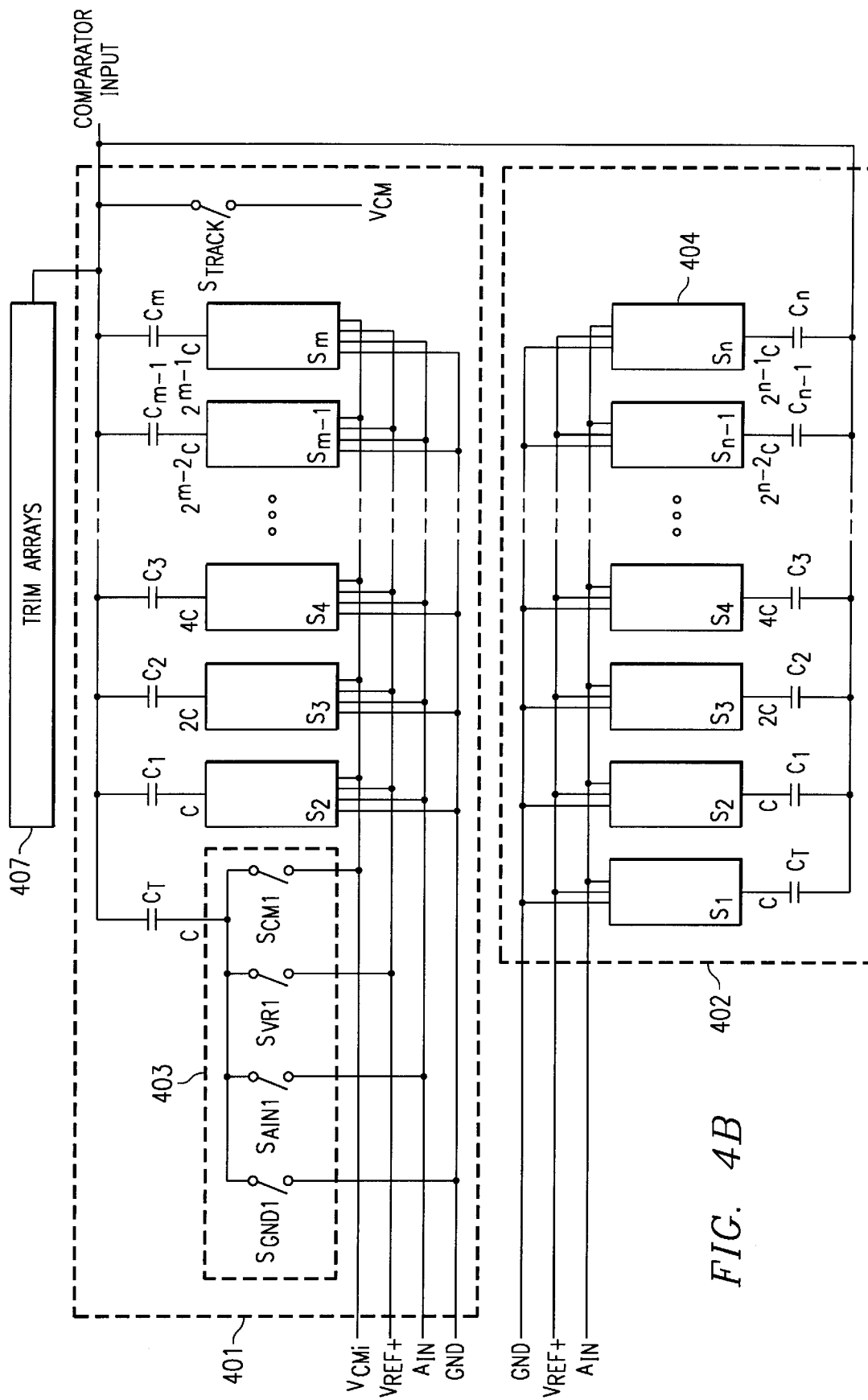
FIG. 4B illustrates one pair of the capacitor arrays of FIG. 4A, in further detail.

A switched-capacitor charge redistribution DAC 400 embodying the present principles is shown in FIG. 4A. In this embodiment, two capacitor arrays are provided for each of the paths into the positive and negative differential inputs into comparator 465 namely, Input Capacitor Array 401 and Offset Compensation Capacitor Array 402. One pair of arrays 401 and 402 is shown in further detail in FIG. 4B. Input Capacitor Array 401 comprises a termination capacitor $C_T$ and an array of capacitors $C_{INi}$, i=1 to m graduated in the sequence C, 2C, 4C, ... $2^{m-2}$C, $2^{m-1}$C(ff). In the following discussion, input capacitors 401 coupled to the positive comparator input are designated $C_{INPi}$ and those coupled to the negative comparator input designated $C_{INNi}$. Generally, the termination capacitors do not participate in the bit-cycling process, except during capacitance calibration (trim) operations.

Offset Compensation Capacitor Array 402, comprises a termination capacitor $C_T$ and an array of capacitors $C_{OFFj}$, j=1 to n, graduated in the sequence C, 2C, 4C, ... $2^{n-2}$C, $2^{n-1}$C (ff). Offset capacitors coupled to the positive comparator input are designated $C_{OFFPj}$ and those coupled to the negative comparator input $C_{OFFNj}$.

The bottom plate of each capacitor in array 401 is associated with a set of switches 403, one of which is shown in further detail. Specifically, each input array switch set includes a switch $S_{AINi}$ for coupling the plate to the analog input voltage $A_{IN+}$ or $A_{IN-}$, a switch $S_{VRi+}$ for coupling to the positive reference voltage rail $V_{REF+}$, a switch $S_{GNDi}$ for coupling to the negative reference rail $V_{REF-}$, in this case GND, and a switch $S_{CMi}$ for coupling to the input common mode voltage $V_{CMI}$ referenced to the differential inputs $A_{IN+}$ and $A_{IN-}$.

A similar set of switches 404, indexed j=1 to m, selectively couple the bottom plates of the capacitors of offset array 402 to the input signal ($A_{IN+}$ or $A_{IN-}$) and the reference voltage ($V_{REF+}$) and GND. After the SAR bit cycling process, the state of switches 403 represent the digitally coded input sample and is stored in registers 406 for output.

Each input capacitor array 401a,b associated with a set of trim arrays 407. At least some of the capacitors in input arrays 401a,b are each associated with a trim array 407 which allow the effective capacitance of the given input capacitors to be calibrated or trimmed to tune performance of the ADC. The number and sizes of the capacitors in each trim array are a function of the required trim resolution. Additional trim capacitors may be provided for redundancy. In the preferred embodiment, the number and size of capacitors in each trim array are selected to total ⅛0 of the input capacitor being trimmed. For example, for the capacitor C7 representing Bit 7, a trim array of seven capacitors adding up to ⅛ C7 may be used, along with one or two additional trim capacitors for redundancy.

An offset calibration cycle is run to selectively charge the capacitors of the offset arrays 402 a,b at the positive and negative inputs to the comparator. In the following discussion, "complementary" sets of capacitors are those coupled by the appropriate switches at a given instant to opposing reference voltages. For example, if capacitor $C_{INPi}$ in input array 401 a at the positive comparator input is coupled to $V_{REF}$, then the corresponding capacitor in $C_{INi}$ in input array 401b at the negative comparator input is coupled to GND, and vice versa. Similarly, if a capacitor $C_{OFFPj}$ in offset array 402a is coupled to $V_{REF}$, capacitor $C_{OFFNj}$ in offset array 402b is coupled to GND, and vice versa.

During the sampling phase of the calibration procedure, the bottom plates of all input capacitors $C_{INPi}$ (i=1 to m) and $C_{INi}$ (i=1 to m) are coupled to the input common mode voltage $V_{CMi}$, which in the illustrated embodiment is approximately Vcc/2. The MSB capacitor of the positive path capacitor offset compensation array 402a is coupled to $V_{REF}$ and the complementary MSB capacitor in offset compensation array 402b is coupled to Gnd. The bottom plates of the remaining positive path offset capacitors 402a are coupled to ground and those the remaining negative path offset capacitors 402 are coupled to $V_{REF}$. The top plates of all the input and offset capacitors, for both paths are coupled to $V_{cm}$, which is the common mode voltage around which the comparator operates through track switches $S_{TRACK}$.

During the calibration conversion phase, a SAR bit cycling process is then performed using only the offset capacitors $C_{OFFPj}$ and $C_{OFFNj}$. The bits on the offset capacitors after bit cycling approximate the inverse of the offset voltage $V_{OFF}$, such that the bit positions of the corresponding switches represent the offset compensation code. During this process, the bottom plates of the input capacitors are coupled to ground.

During subsequent normal mode operation, the input capacitors $C_{INPi}$ and $C_{INNi}$ are coupled to the system inputs to sample the differential analog inputs $A_{INP}$ and $A_{INN}$. During normal mode sampling, the MSB offset capacitor of the positive path and the LSB offset capacitor of the negative path are coupled to $V_{REF}$ while the LSB offset capacitors of the positive path and the MSB capacitor of the negative path are coupled to ground. A SAR bit cycling operation is then performed through the input capacitors $C_{INPi}$ and $C_{INNi}$. During the normal operation conversion phase, the offset capacitors $C_{OFFPj}$ and $C_{OFFNj}$ are selectively coupled to $V_{REF}$ and ground to reflect the offset compensation codes determined during the calibration operations.

Figure 5:
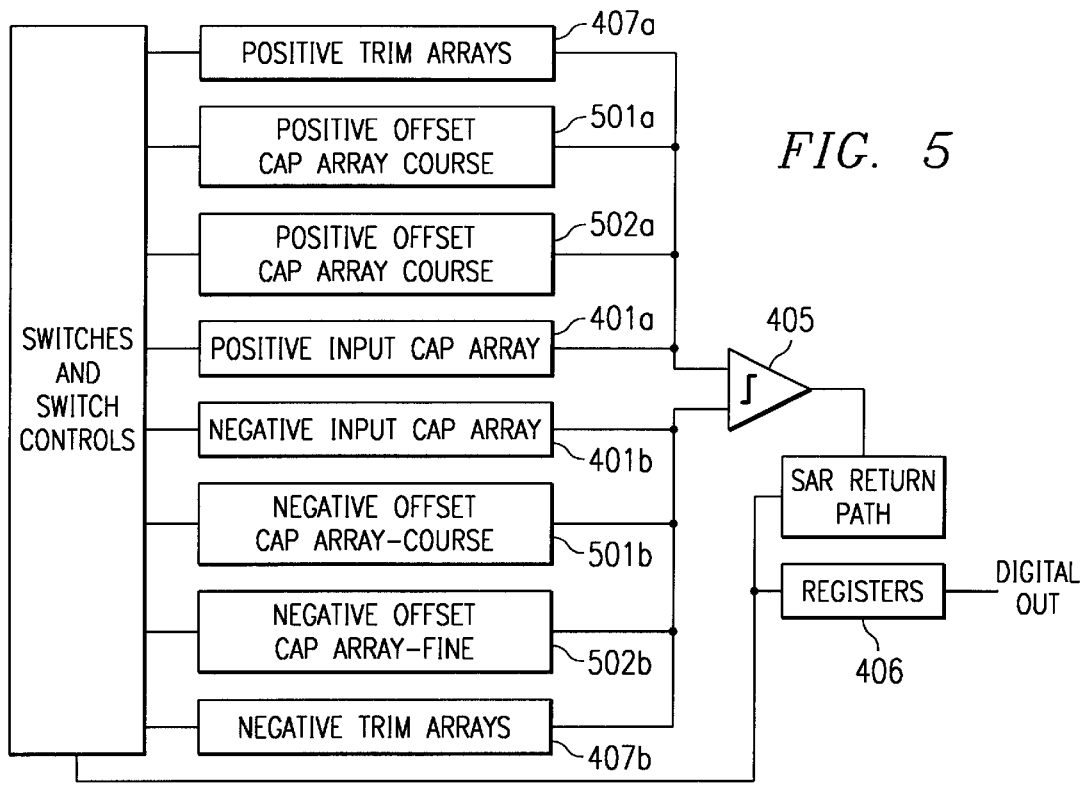
FIG. 5 is a functional block diagram of a second charge redistribution ADC embodying the present principles.

An alternate embodiment is depicted in FIG. 5 Here, two offset arrays are provided at each of the comparator inputs.

For a complete description of the operation of this embodiment and its advantages, reference is now made to coassigned application U.S. Ser. No. 09/1919,181 by inventor Somayajula, entitled "CIRCUITS AND METHODS FOR OFFSET VOLTAGE COMPENSATION IN A CHARGE REDISTRIBUTION DIGITAL TO ANALOG CONVERTER" incorporated above by reference.

In charge redistribution ADCs, capacitor calibration is important for insuring proper coding resolution. This can be done by associating at least some of the primary capacitors with an array of trim capacitors which can be switched in or switched out in parallel with the capacitor being calibrated to adjust its effective capacitance. Generally, in a bit-weighted capacitor array, where capacitor size graduates by powers of two, a given capacitor can be trimmed such that its capacitance approximately equals the sum of the capacitances of the preceding capacitors in the array (i.e. those representing lesser significant bits). For example, in arrays $401a,b$ the theoretical capacitance of capacitor $C_3$ is $4C$, which is the sum of the capacitances of $C_T$, $C_1$ and $C_2$. Therefore, given $C_1$ and $C_2$, a trimming capacitance can be added in parallel in the trim array such that the trimmed valued $C_3'=C_1+C_2+C_T$. Once capacitor $C_3$ is trimmed, $C_4$ can be trimmed, where $C_4'=C_1+C_2+C_3'+C_T$, and so on.

One particular technique for implementing this self-calibration scheme is by applying a successive approximation algorithm or similar routine to the trim capacitor array. Continuing the example of calibrating capacitor $C_3$, the bottom plate of LSB capacitors $C_{1\ and\ C2}$ are coupled to $V_{REF}$ and bottom plates of capacitor $C_3$ and its trim array $C_3'$ are coupled to Gnd during the sampling phase (for the positive path). Additionally, the bottom plates of remaining capacitors $C_4$–$C_m$ are coupled to ground. The complementary voltages are applied to the opposite input array to the inputs of comparator 209 during sampling.

A bit cycling routine is performed through the trim arrays for capacitors $C_3$ of the positive and negative paths, in the manner discussed above for the primary arrays during the conversion phase. During this process, bottom plates of capacitors $C_1$ and $C_2$ and $C_4$–$C_m$ are coupled to Gnd and that of capacitor $C_3$ to $V_{REF}$, for the positive path. For the negative path, capacitors $C_1$, $C_2$ and $C_4$–$C_m$ are coupled to $V_{REF}$ and capacitor $C_3$ is coupled to $G_{ND}$.

One problem with this process is non-constant charge injection onto the top plates of capacitors 401 by track switches 405 ($S_{track}$) as the impedance on the bottom plates changes with the configuration of switches 403 and 404. As discussed above, during offset compensation the bottom plates of capacitors $401a,b$ are coupled to $V_{CMi}$, and the offset compensation capacitors 402 appropriately configured, when track switches 405 are closed to $V_{cm}$ during the sampling phase. Hence, track switches 405 are presented with a certain impedance and inject a corresponding amount of charge onto the top plates of capacitors 401 when they subsequently open before the start of the conversion phase. On the other hand, during capacitor calibration, some of the input and offset compensation capacitors are coupled to Gnd and others to $V_{REF}$ during sampling, presenting a different impedance to track switches 405. Consequently, a different amount of charge is injected onto the upper plates of capacitors 401 and 402 and the trim capacitors when the track switches open. This resulting charge injection mismatch between the offset compensation and capacitor calibration operations manifests itself as a capacitance mismatch at the comparator input. In other words, code dependency has been introduced into the capacitance calibration process.

According to the present inventive principles, before the calibration of a given capacitor pair by trimming, the charge injected by the track switches 405 is captured at the input nodes of the comparator. The offset compensation procedure discussed above is then performed to compensate for the mismatch induced voltage offset, along with the offset voltage introduced by the comparator. The capacitors being calibrated can then be trimmed using a trim array 407.

Figure 6:
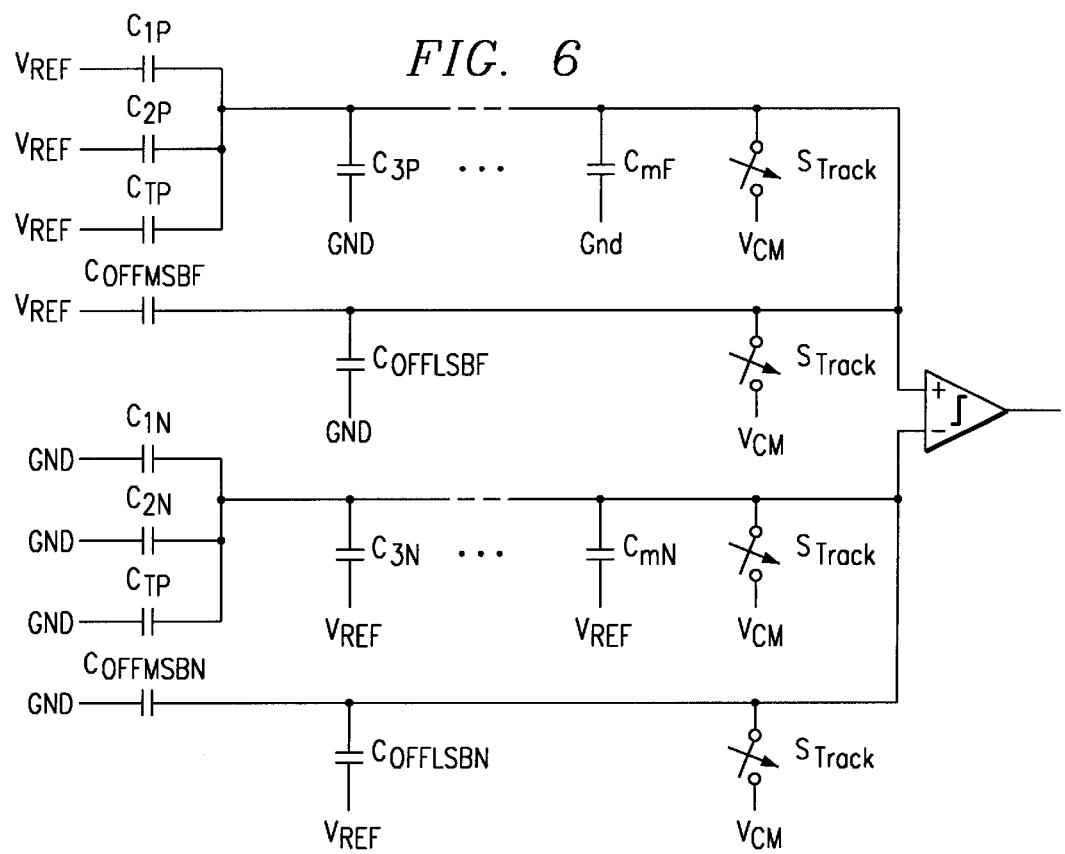
FIG. 6 is a conceptual schematic diagram showing the charge redistribution ADC of FIG. 4A at the start of the sampling phase of the offset calibration procedure.
Figure 7:
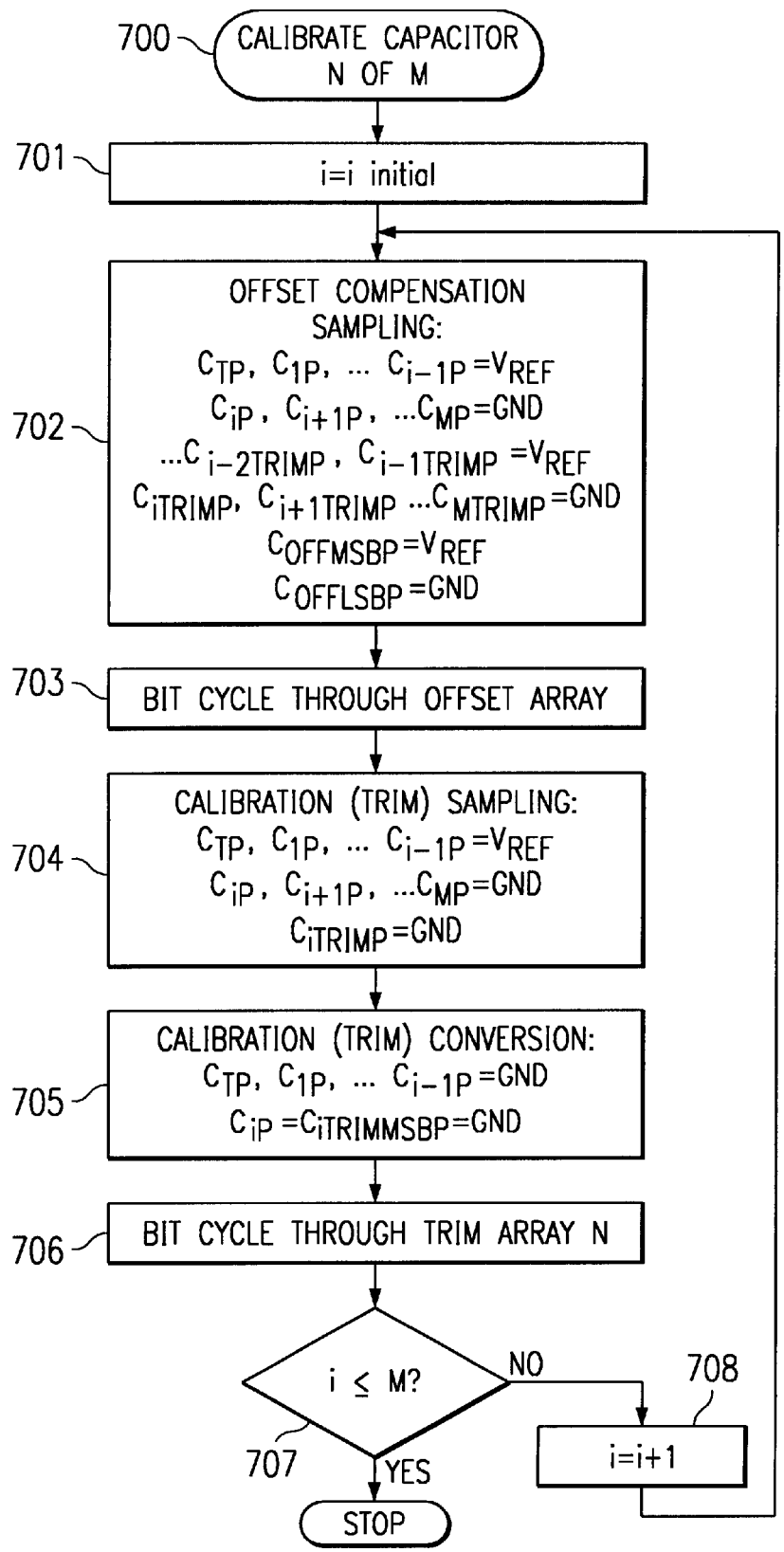
FIG. 7 is a flow chart illustrating a preferred calibration procedure where the switch settings for the positive path are shown - those of the negative path being complimentary.

A preferred calibration procedure 700 is shown in the flow chart of FIG. 7, where the switch settings for the positive path are shown—those of the negative path being complimentary. Consider for example the calibration of capacitors $C_{3P}$ and $C_{3N}$ (i initial at Step 701=3). (These capacitors have been arbitrarily selected for purposes of discussion—the present calibration process generally is the same for any input capacitor pair associated with at least one trim capacitor). The offset compensation sampling phase is performed at Step 702 and as shown in FIG. 6. For the positive path, the termination capacitors $C_T$ and input capacitors $C_{1P}$ and $C_{2P}$ are coupled to $V_{REF}$, along with their associated trim capacitors, if any. The capacitor being calibrated, and any higher significant bit capacitors (i.e. capacitors $C_{3P}$–$C_{mP}$) are coupled to ground, along with the $C_{3P}$–$C_{mP}$ trim arrays $C_{3PTRIM}$–$C_{mPTRIM}$. The negative path is set up in the complementary configuration and the offset capacitor arrays 403 configured as described above for the offset compensation sampling phase. (For the positive path, the MSB offset compensation capacitor $C_{OFFMSBP}$ is coupled to $V_{REF}$ and the remaining capacitors $C_{OFFLSBP}$ coupled to Gnd. For the negative path, $C_{OFFMSBN}$ is coupled to Gnd and $C_{OFFLSBN}$ are coupled to $V_{REF}$). Track switches $S_{TRACK}$ then close.

When tracking switches $S_{Track}$ open at the end of the sampling phase, the offset at the input to comparator 209 includes that introduced by charge injection from particular switch configuration used during the sampling phase of the capacitor calibration process discussed below.

Offset compensation bit cycling (conversion phase) is then performed at Step 703 through the offset arrays $402a,b$ to compensate for both the offset due to charge injections and the comparator induced offset. During this operation, the input and trim capacitor arrays remain in the same state as during the offset compensation sampling phase. In other words, these capacitors do not participate in the conversion process per se, but instead provide the proper impedance at the inputs to the comparator for setting the track switch charge injection induced offset.

After the offset compensation is performed, capacitors $C_{3P}$ and $C_{3N}$ can be trimmed using associated trimming arrays $C_{3PTrim}$ and $C_{3NTrim}$ such that they match the sums of capacitors $C_{1P}$ and $C_{2P}$ and $C_{1N}$ and $C_{2N}$, respectively.

During the calibration sampling phase (Step 704), for the positive path, input capacitors $C_{1P}$ and $C_{2P}$ and the termination capacitor $C_T$ are coupled to $V_{REF}$ and capacitors $C_{3P}$–$C_{mP}$ and the $C_3$ trim capacitors ($C_{3Trim}$) are coupled to ground. The complementary configuration is set-up for the negative path. During the calibration conversion phase (Step 705), input capacitors $C_{1P}$ and $C_{2P}$ and the termination capacitor $C_T$ are recoupled to Gnd and capacitor $C_3$ and the MSB $C_3$ trim capacitor ($C_{3PTrimMSB}$) recoupled to $V_{REF}$. for the positive path. Similar switching is done for the negative path with the complementary voltages.

A SAR bit cycling process is then performed through trim array $C_{3pTrim}$, starting with $C_{3PTrimMSB}$ (at Step 706). If the output of comparator-latch 209 swings low, then trim capacitance is added in parallel with capacitor $C_{3P}$ (by coupling the bottom plate of the trim capacitor being tested with the bottom plate of capacitor $C_3$) for the positive path and capacitor $C_{3N}$ for the negative path (i.e. the trim capacitor is kept). Conversely, if the comparator-latch output swings high, then the trim capacitors being tested are not kept and the corresponding bottom plates are simply coupled to ground. The resulting trimmed capacitances $C'_{3P}$ and $C'_{3N}$ are parallel combinations of input capacitance $C_{3P}$ and $C_{3N}$ the "kept" trim capacitors $C_{3pTrim}$, and $C_{3NTrim}$.

At Steps 707 and 708, the procedure continues to the next capacitor in the input array (i=i+1) and repeats until the last capacitor is reached (i=m). The calibration procedure in this example is repeated for capacitor $C_4$–$C_m$. For the case of capacitors $C_{4P}$ and $C_{4N}$, for example, trimmed capacitors $C'_{3P}$ and $C'_{3N}$ are coupled and decoupled to the reference voltages $V_{REF}$ and Gnd as was done with capacitors $C_1$ and $C_2$ during the calibration of capacitors $C_3$.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A method of linear capacitor calibration in a switched capacitor circuit including first and second arrays of capacitors and at least one trim capacitor, each capacitor having a first plate coupled to a node, comprising the steps of:
   coupling second plates of each of the capacitors of the first array and the trim capacitor to a selected one of first and second reference voltages to present a corresponding impedance at the node;
   sampling the corresponding first and second reference voltages on to the capacitors of the first array and the trim capacitors with a switch coupled to the node, the switch injecting an amount of charge on the node;
   coupling second plates of each capacitor of the second array to a selected one of the first and second voltages to compensate for a voltage offset caused by the injected charge; and
   recoupling the second plate of the trim capacitor to a selected one of the first and second voltages to calibrate a corresponding capacitor the first array.

2. The method of claim 1 wherein said step of selectively coupling the second plates of the capacitors of the first array and the trim capacitor to a selected one of first and second reference voltages comprises the substeps of:
   coupling the second plate of a selected capacitor of the first array to the first reference voltage; and
   coupling the second plate of the trim capacitor and the selected one of the capacitors being calibrated to the second reference voltage.

3. The method of claim 1 wherein the first reference voltage is a positive reference voltage and the second reference voltage is ground.

4. The method of claim 1 wherein the first reference voltage is ground and the second reference voltage is a positive reference voltage.

5. The method of claim 1 wherein said step of sampling comprises the step of coupling the node to a common mode voltage.

6. The method of claim 1 wherein said step of selectively coupling the second plates of the capacitors of the second array comprises the substep of performing a bit-cycling routine through the capacitors of the second array.

7. The method of claim 1 wherein the trim capacitor comprises one of a plurality of capacitors in a trim array and said step of recoupling comprises the substep of performing a bit cycling operation through the capacitors of the trim array.

8. A charge redistribution analog to digital converter comprising:
   a comparator for comparing voltages presented at first and, second comparator inputs;
   an input capacitor array coupled to the first comparator input;
   an offset compensation capacitor array coupled to the first comparator input;
   a trim capacitor array coupled to the first comparator input; and
   switching circuitry for:
      during an offset compensation sampling phase:
         coupling a selected capacitor of the input array to a first reference voltage and a selected capacitor of the input array being calibrated to a second reference voltage;
         coupling selected capacitors of the trim array to the second reference voltage; and
         sampling the first and second reference voltages onto the selected capacitors of the input and trim capacitor arrays, the switching circuitry causing a voltage offset at the first input of the comparator;
      during an offset compensation conversion phase bit cycling through the capacitors of the offset compensation array to compensate for the voltage offset; and
      during a calibration phase, bit cycling through capacitors of the trim array to calibrate the selected capacitor of the input array being calibrated.

9. The analog to digital converter of claim 8 wherein the trim array is a selected one of a plurality of trim arrays, each trim array associated with a capacitor in the input array.

10. The analog to digital converter of claim 8 wherein the first comparator input is a positive input and the first reference voltage is a positive reference voltage and the second voltage is ground.

11. The analog to digital converter of claim 8 wherein the first comparator input is a negative input and the first reference voltage is ground and the second reference voltage is a positive reference voltage.

12. The analog to digital converter of claim 9 wherein the trim array comprises a plurality of capacitors of a number selected as a function of a bit being represented by the capacitor of the input array being calibrated and a desired calibration resolution.

13. The analog to digital converter of claim 8 wherein the offset compensation capacitor array is a selected one of a plurality of offset compensation capacitor arrays coupled in parallel to the first comparator input.

14. The analog to digital converter of claim 8 wherein the analog to digital converter is a selected one of a plurality of like interleaved analog to digital converters.

15. A switched-capacitor circuit comprising:
   a plurality of capacitor arrays coupled to a node including an input array, a trim array associated with a selected capacitor of the input array and an offset compensation array;

a first plurality of switches for selectively coupling capacitors of the input and trim arrays to selected reference voltages to approximate an impedance presented at the node during a subsequent operation to trim the selected capacitor of the input array;

a sampling switch for sampling the selected reference voltages onto the input and trim arrays, the sampling switch injecting a corresponding amount of charge on the node; and a second plurality of switches for selectively coupling capacitors of the offset compensation array to the selected reference voltages to compensate for the amount of charge injected on the node.

16. The switched capacitor circuit of claim 15 and further comprising a third plurality of switches for selectively coupling capacitors of the trim array to the selected reference voltages to trim the associated selected capacitor of the input array.

17. The switched capacitor circuit of claim 15 wherein the node is coupled to an input of a comparator circuit.

18. The switched capacitor circuit of claim 15 wherein the first and second plurality of switches are controlled by a successive approximation return path.

19. The switched capacitor circuit of claim 15 wherein the plurality of capacitor arrays form a portion of a charge-redistribution analog to digital converter.

20. The switched capacitor circuit of claim 15 wherein the selected reference voltages are selected from the group comprising a positive reference voltage and ground.

* * * * *